United States Patent [19]

Schuller et al.

[11] Patent Number: 4,564,564
[45] Date of Patent: Jan. 14, 1986

[54] SUPERCONDUCTING MAGNET WIRE

[75] Inventors: Ivan K. Schuller, Woodridge; John B. Ketterson, Evanston, both of Ill.; Indrajit Banerjee, San Jose, Calif.

[73] Assignee: The United States of America as represented by the United States Department of Energy, Washington, D.C.

[21] Appl. No.: 523,990

[22] Filed: Aug. 16, 1983

[51] Int. Cl.$^4$ .................. B32B 15/04; B32B 15/20; H01L 39/12
[52] U.S. Cl. .................. 428/662; 428/674; 428/926; 428/930
[58] Field of Search .......... 428/930, 611, 607, 662, 428/674, 926; 29/599; 174/1215, 1285; 335/296

[56] References Cited

U.S. PATENT DOCUMENTS 3,458,293  7/1969  Schindler .................. 428/930
4,202,931  5/1980  Newhunter et al. .......... 428/930
4,448,854  5/1984  Schuller et al. ............ 427/611

OTHER PUBLICATIONS

Schuller, I. K. et al; "Layered Ultrathin Coherent Structures"; Argonne National Laboratory Publication U.A.C. 43082; 6 pages, (11-1-79).
Schuller, I. K.; "New Class of Layered Materials"; Physical Rev. Letters, vol. 44, No. 24, pp. 1597-1600, (6/16/80).
Zheng, J. Q. et al; "Superconducting and Transport Properties of NbTi Layered Metals"; Physica, vol. 108B, pp. 945-946, (1981).
Schuller, I. K. et al; Layered Ultrathin Coherent Structures"; Inhomogeneous Superconductors-1979, pp. 197-202, (1979).
Banerjee, I.; Superconductivity in Nb/Cu Superlattices, PhD Dissertation, Northwestern University, pp. 1 to 133, (8-31-82).

Primary Examiner—L. Dewayne Rutledge
Assistant Examiner—John J. Zimmerman
Attorney, Agent, or Firm—William Lohff; James W. Weinberger; Judson R. Hightower

[57] ABSTRACT

A superconducting tape or wire with an improved critical field is formed of alternating layers of a niobium-containing superconductor such as Nb, NbTi, Nb$_3$Sn or Nb$_3$Ge with a thickness in the range of about 0.5-1.5 times its coherence length, supported and separated by layers of copper with each copper layer having a thickness in the range of about 170-600 Å.

15 Claims, 2 Drawing Figures

SUPERCONDUCTING MAGNET WIRE

CONTRACTUAL ORIGIN OF THE INVENTION

The United States Government has rights in this invention pursuant to Contract No. W-31-109-ENG-38 between the U.S. Department of Energy and the University of Chicago representing Argonne National Laboratory.

BACKGROUND OF THE INVENTION

In the operation of superconducting magnets for use in magnetohydrodynamic (MHD) and plasma devices, superconductors are utilized to provide the required high electrical currents. Commonly, the superconductors are constructed of one or more layers of a superconductor such as a niobium compound and a conventional conductor such as copper. The presence of the copper conductor provides a current carrying capacity if the superconductor is switched to its resistance mode by the field or temperature exceeding the critical values.

To avoid the switching between the superconducting and resistance modes for the superconductor, it is important that the critical values of field ($H_c$) and/or temperature ($T_c$) be as large as possible to tolerate variations in operating conditions of superconducting magnets. Also with respect to critical field values, improvements in this factor may permit more efficient designs of the magnets.

Accordingly, one object of this invention is a superconductor having an improved value of critical field. Another object of the invention is a superconductor for a superconducting magnet with the superconductor having ductility for forming coils. These and other objects will become apparent from the detailed description.

SUMMARY OF THE INVENTION

Briefly, this invention is directed to a superconducting tape or wire composed of alternating layers of copper and a niobium-containing superconductor such as niobium or NbTi, $Nb_3Sn$ or $Nb_3Ge$. In general, each layer of the niobium-containing superconductor has a thickness in the range of about 0.5-1.5 times its coherence length (which for $Nb_3Sn$ is 41 Å) with each copper layer having a thickness in the range of about 170-600 Å. With the use of very thin layers of the niobium composition having a thickness within the desired range, the critical field ($H_c$) may be increased by factors of 2-4. Also, the thin layers of the superconductor permit the the resulting tape or wire to exhibit suitable ductility for winding on a magnet core. These compositions are also characterized by relatively high values of critical temperature and therefore will exhibit a combination of useful properties as superconductors.

DETAILED DESCRIPTION OF THE PREFERRED EMBODIMENT

Figure 1:
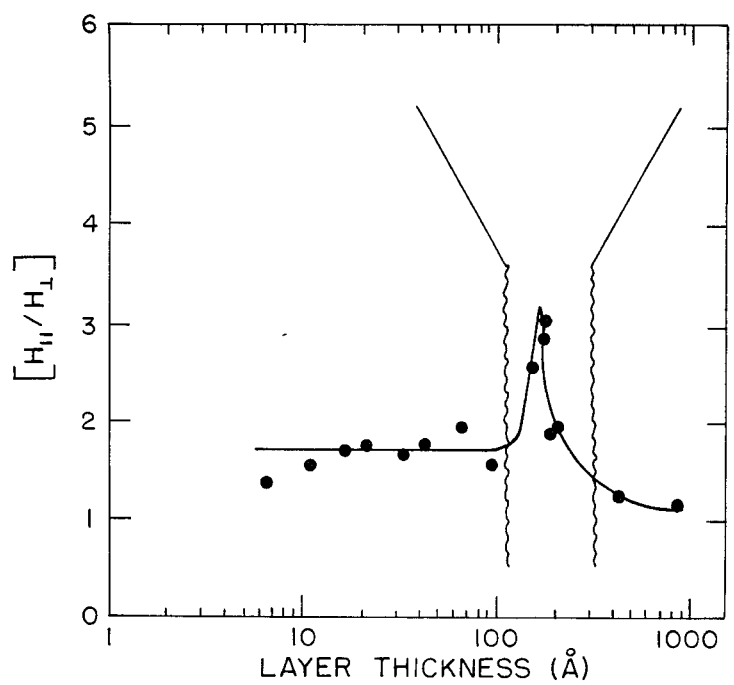
FIG. 1 is a graph of critical field (based on $H_\parallel/H_\perp$) versus thickness for niobium.

The superconducting tape or wire of the invention includes alternating layers of a niobium-containing superconducting composition of niobium or niobium compound with a thickness in the range of about 0.5-1.5 times its coherence length supported and separated by layers of copper with each copper layer having a thickness in the range of about 170-600 Å. Preferably, the niobium compound is NbTi, $Nb_3Sn$ or $Nb_3Ge$ and the thickness of each layer is in the range of about 0.75-1.25 times its coherence length. Values of coherence length are 400 Å for Nb, 58 Å for NbTi, 41 Å for $Nb_3Sn$ and 33 Å for $Nb_3Ge$. As illustrated in FIG. 1, the selection of thickness within the desired range provides an improvement in critical field of about 200-400%.

The copper thickness is sufficient to avoid crosseffects from adjacent superconductive layers but sufficiently thin so that the superconductivity is not excessively depressed in the superconducting material. Suitably, this range is about 170-600 Å and preferably about 300-450 Å.

Suitably, the tape or wire is constructed of a plurality of layers, advantageously at least about 100 layers and preferably about 100-500 layers of superconducting niobium or niobium compound separated and supported by layers of copper. As an illustration, the superconducting tape or wire may be required to have a current carrying capacity of about $1-5 \times 10^6$ amp/cm$^2$. If 100 amps are required for a superconducting coil, the total thickness for the superconductor portion for a width of 1 cm would be $1 \times 10^{-4}$ cm (for a capacity of $1 \times 10^6$ amp/cm$^2$) or 10,000 Å. If the coherence length is about 50 Å, the total number of layers would be about 200 layers with each layer about 50 Å in thickness for the superconductor and 500 Å in thickness for the copper. The total thickness would be about 10,000 Å + 80,000 Å or $9 \times 10^{-4}$ cm. In general at these and greater thicknesses, the tape or wire would be self supporting and exhibit ductility sufficient to form a coil on a magnet core.

Figure 2:
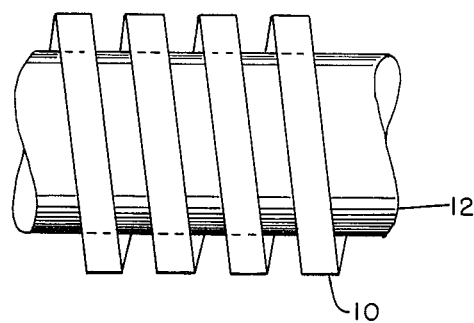
FIG. 2 is a representative side view of a portion of a superconducting tape or wire on a core as one embodiment of this invention.

As illustrated in FIG. 2, a coil is provided by winding the tape or wire 10 in a spiral manner about the magnet core 12. Supports and other parts of the assembly may be those used conventionally.

As disclosed herein, the invention provides a superconducting tape or wire with improved critical field and useful for superconducting magnets and the like.

The embodiments of the invention in which an exclusive property or privilege is claimed are defined as follows:

1. A superconducting metallic tape comprising at least 100 alternating layers of a niobium-containing superconductor and copper, with each layer of the superconductor having a thickness in the range of about 0.5-1.5 times the coherence length for the superconducting composition and each copper layer thickness in the range of about 170-600 Å.

2. The metallic tape of claim 1 wherein the superconducting composition is Nb.

3. The metallic taper of claim 1 wherein the superconductor is $Nb_3Sn$.

4. The metallic tape of claim 1 wherein the superconductor is $Nb_3Ge$.

5. The metallic tape of claim 1 wherein the superconductor is NbTi.

6. The metallic tape of claim 1 wherein the superconductor layer is about 0.75-1.25 times the coherence length for the superconductor.

7. The metallic tape of claim 6 wherein the copper layer is about 300-450 Å.

8. The metallic tape of claim 7 wherein the tape is self-supporting, ductile and is composed of about 100–500 layers of the superconductor.

9. The metallic tape of claim 8 wherein the superconductor is Nb.

10. The metallic tape of claim 8 wherein the superconducting composition is $Nb_3Sn$.

11. The metallic tape of claim 7 wherein the superconducting composition is $Nb_3Ge$.

12. The metallic tape of claim 7 wherein the superconducting composition is NbTi.

13. A superconducting magnet comprising a magnet core and a superconducting tape wound about the core and formed of a plurality of the alternating layers of the niobium-containing superconductor and copper of claim 1.

14. The magnet of claim 13 wherein the superconductor is Nb.

15. The magnet of claim 13 wherein the superconductor is $Nb_3Sn$.

* * * * *